(12) United States Patent
Cubero Pitel

(10) Patent No.: US 7,052,619 B2  
(45) Date of Patent: May 30, 2006

(54) METHOD FOR MANUFACTURING PRINTED CIRCUIT BOARDS FROM AN EXTRUDED POLYMER

(75) Inventor: Jose Antonio Cubero Pitel, Tarragon Valls (ES)

(73) Assignee: Lear Corporation, Southfield, MI (US)

( * ) Notice: Subject to any disclaimer, the term of this patent is extended or adjusted under 35 U.S.C. 154(b) by 333 days.

(21) Appl. No.: 10/707,338

(22) Filed: Dec. 5, 2003

(65) Prior Publication Data
US 2004/0131764 A1 Jul. 8, 2004

(51) Int. Cl.
H01B 13/00 (2006.01)

(52) U.S. Cl. .............................. 216/14; 216/17; 216/19

(58) Field of Classification Search .................. 216/14, 216/17, 19
See application file for complete search history.

(56) References Cited

U.S. PATENT DOCUMENTS 6,551,849 B1* 4/2003 Kenney ........................ 438/34

2003/0075532 A1* 4/2003 Salmon et al. ......... 219/121.69
2003/0180448 A1* 9/2003 Brook-Levinson et al. ... 427/96
2003/0197285 A1* 10/2003 Strandberg et al. ......... 257/778

* cited by examiner

Primary Examiner—Nadine Norton  
Assistant Examiner—Binh X. Tran  
(74) Attorney, Agent, or Firm—Bruce E Harang

(57) ABSTRACT

Manufacturing process for manufacturing printed circuit boards from an extruded polymer, comprising the steps:-preparing an electro-conductive plate (10) and form embossments (11) by means of selective engraving on a first side (10a), corresponding to future tracks and depressions (12) corresponding to future inter-track areas;-applying a dielectric substrate material, in a pasty or semi-pasty state, according to a first sheet (20a) obtained by extrusion of a thermalplastic material, arranging it on said first side (10a), covering said embossments (11) and filling said depressions (12), and subjecting the first sheet (20a) and plate (10) assembly to a predetermined pressure so that the dielectric substrate material completely fills said depressions and encloses said embossments (11), and-on the hardened dielectric substrate, carrying out a second selective engraving on a side opposite the first side (10a), removing the material corresponding to said future inter-track areas.

18 Claims, 4 Drawing Sheets

METHOD FOR MANUFACTURING PRINTED CIRCUIT BOARDS FROM AN EXTRUDED POLYMER

DETAILED DESCRIPTION

The present invention refers to a process for manufacturing printed circuit boards with conductive tracks on one or both sides thereof, whose dielectric substrate is obtained from an extruded polymer.

BACKGROUND OF THE INVENTION

Patent application PCT/ES99/00413, from the same holder, which also refers a process for manufacturing printed circuit boards, discloses a process with several steps, which comprises carrying out a first selective engraving by machining or by etching on a first side of a plate of electro-conductive material and applying a dielectric material, by means of a jet molding operation, on said side of the plate of electro-conductive material. Prior to jet molding, the plate of electro-conductive material is subjected to a surface treatment for improving the junction capacitance, and a layer of an adhesive material is preferably applied onto said first engraved and superficially treated side.

A second selective engraving can also be carried out on a second side, opposite the first.

The process disclosed in said patent application ensures a strong junction between the conductive tracks and the dielectric substrate, but the jet molding implies an anisotropy in the jet molded dielectric (differentiated orientation of fibers in the zone next to the jet molding nozzles with regard to those farther away and which become stiff upon losing part of their fluidity) and properties that are sensitive to orientation, such as greater tensile strength in the sense of orientation lead to the boards having unwanted curving or bending in non-stable conditions (processing the plates and temperature variations), which can lead to endangering the integrity of the printed circuit (conductive layer to dielectric substrate junction).

U.S. Pat. No. 4,671,301 discloses the manufacture of a board carried out by continuously molding a mixture of resin and uniformly distributed filling materials.

The incorporation of filling materials in the resin is a well known technique for improving the physical and chemical properties thereof.

BRIEF EXPLANATION OF THE INVENTION

The object of the present invention is a process for manufacturing printed circuit boards from an extruded polymer in which a strong junction is ensured between the conductive tracks and the dielectric substrate thereof. This dielectric substrate will also be substantially free of directional internal tensions, the origin of board deformations and curving.

According to the present invention, on one hand, a first selective engraving, by machining or by etching, is carried out on a first side of a plate of electro-conductive material to form several embossments corresponding to future tracks and several depressions corresponding to future inter-track areas. To increase the junction resistance between materials, said first engraved layer is subjected to a surface treatment for improving its junction capacitance after the first engraving step, and a layer of adhesive material is subsequently applied on said engraved and superficially treated first side.

The indicated phases are carried out in a basically equivalent manner as that explained in said patent application PCT/ES99/00413.

Parallely and on the other hand, at least one sheet of extruded dielectric is obtained. The dielectric in one possible embodiment example is a uniform mixture of polyphenyl sulfide, mica and reinforced fiberglass, in variable ratios. The thickness of the extruded sheet, the mass temperature and extrusion speed are adjustable.

In accordance with the proposed process, said heated first extruded sheet is deposited on said first layer of the plate (10) of electro-conductive material; and the first sheet and plate assembly is subjected to a predetermined pressure so that the dielectric substrate material completely fills said depressions and encloses said embossments, thus obtaining a strong junction of the substrate to the conductive metallic layer.

For the purpose of increasing the stability of the printed circuit board, two or more interlaced layers have been foreseen or arranged, which are superimposed prior to the pressing operation, such that the orientation of the fibers derived from the extrusion in both directions tends to be compensated, or foreseeing a stirring device next to the extrusion nozzle preventing a main orientation of the fibers of the material upon being extruded.

In order to better understand the features of the proposed process, the main steps thereof will be detailed with reference to several sheets of drawings in which:

DETAILED DESCRIPTION OF EMBODIMENT EXAMPLES

Figure 1:
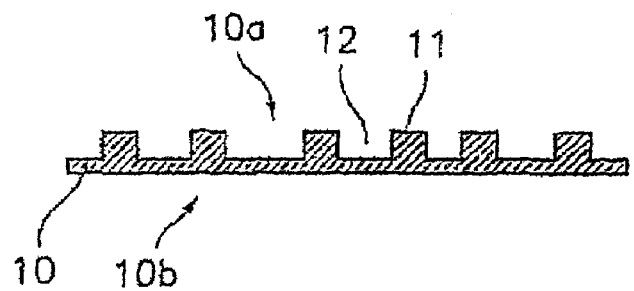
FIGS. 1 to 3 show elevational and cross-sectional views of the preparation steps of a metallic sheet to be strongly joined to a substrate according to the principles detailed in said patent application PCT/ES99/00413.
Figure 4:
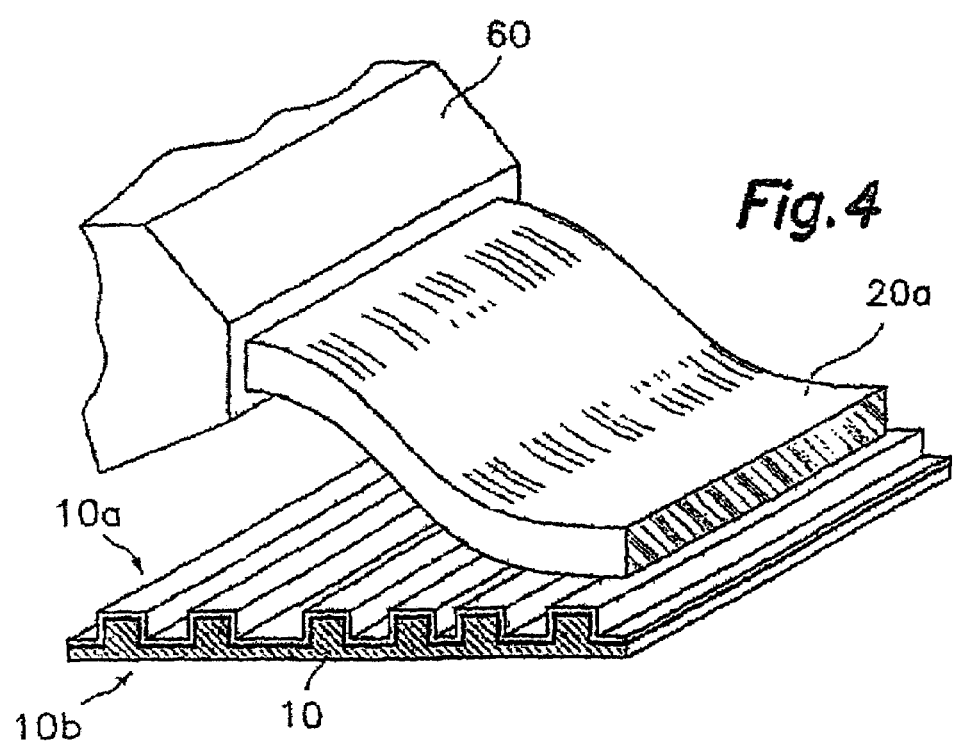
FIG. 4 shows a perspective view schematically showing the principle of this invention, in other words, depositing an extruded sheet of a dielectric material on the treated side of said metallic sheet, from which the circuit tracks will be obtained.
Figure 6:
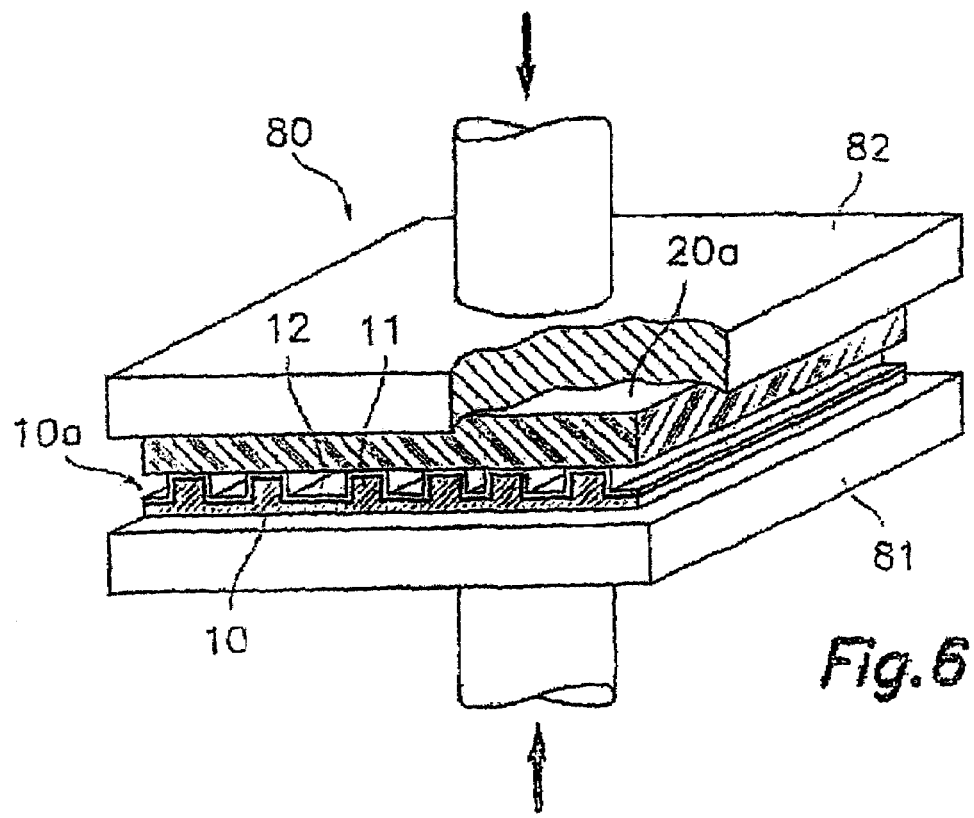
FIG. 6 shows the step for applying a predetermined pressure so that the material that is to constitute the dielectric substrate (formed by one or more extruded sheets, in the example, one) completely fills the depressions and encloses the embossments made on the plate of electro-conductive material subjected to the prior operations detailed in said FIGS. 1 to 3.
Figure 7:
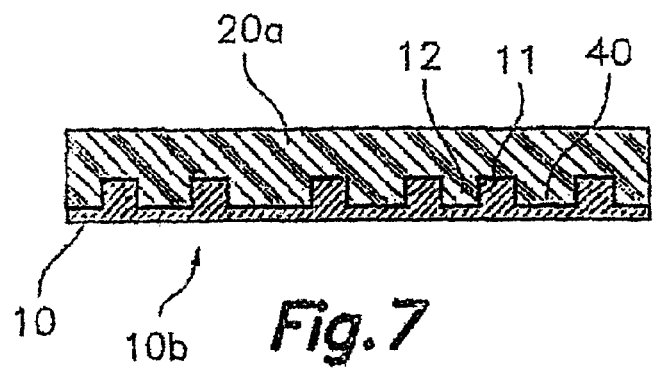
FIGS. 7 to 10 show elevational and cross-sectional views of additional steps for treating the strongly joined extruded sheet and plate of electro-conductive material assembly (FIG. 7) until producing the tracks suitably defining the printed circuit (FIG. 10), also operating according to that indicated in said patent application PCT/ES99/00413.
Figure 8:
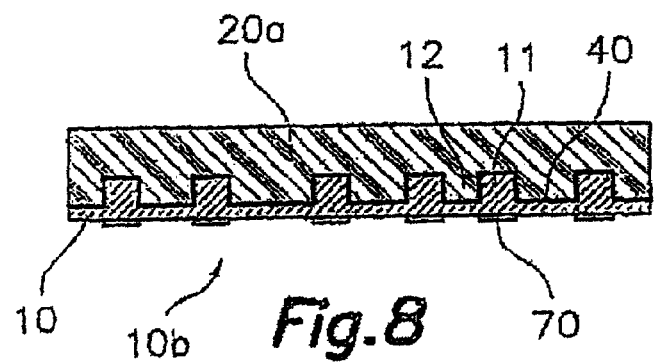
Figure 9:
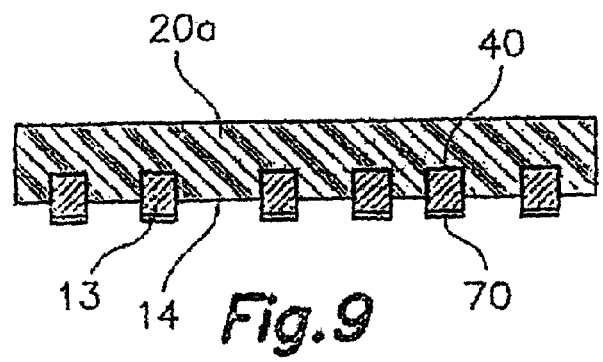
Figure 10:
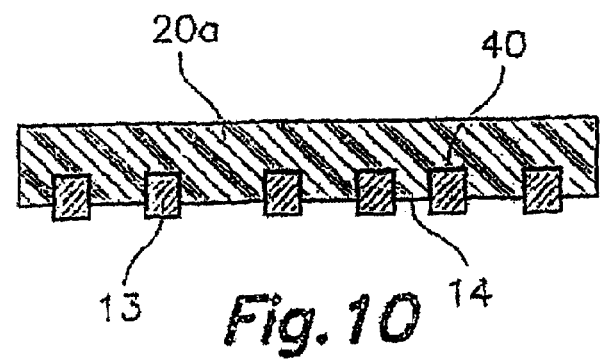

According to that previously indicated, the proposed method comprises the following basic steps: preparing at least one plate (10) of electro-conductive material, such as a copper plate, carrying out a first selective engraving on a first side (10a) thereof so as to form several embossments (11) corresponding to future tracks and several depressions (12) corresponding to future inter-track areas (FIG. 1); applying a dielectric substrate material, in a pasty or semi-pasty state, on said first side (10a) of the plate (10) of electro-conductive material, covering said embossments (11) and filling said depressions (12); and once said dielectric substrate material has hardened, carrying out a second selective engraving on a second side (10b), opposite the first, of said at least one plate (10) of electro-conductive material so as to eliminate the material thereof corresponding to said future inter-track areas; giving finished tracks (13) isolated from each other as a result, separated by inter-track areas (14) and partially enclosed on one side by said dielectric substrate material, with the particularity, according to the invention, that said step for applying a substrate material comprises: obtaining by extrusion at least one first sheet (20a) of said dielectric substrate material from a thermal-plastic material (FIG. 4); depositing said first heated sheet (20a) on said first side (10a) of the plate (10) of electro-conductive material (FIG. 4); and subjecting the first sheet (20a) and plate (10) assembly to a predetermined pressure so that the dielectric substrate material completely fills said depressions (12) and encloses said embossments (11) (FIG. 6).

As shown in FIG. 6, said step for depositing the first heated sheet (20a) on the first side (10a) of the plate (10) of electro-conductive material includes placing the plate (10) between several plates (81, 82) of a press (80) located immediately next to the outlet of an extrusion machine (60) of said thermal-plastic dielectric substrate material and then depositing said first sheet (20a), as it comes out of said extrusion machine (60), on the plate (10).

Figure 5:
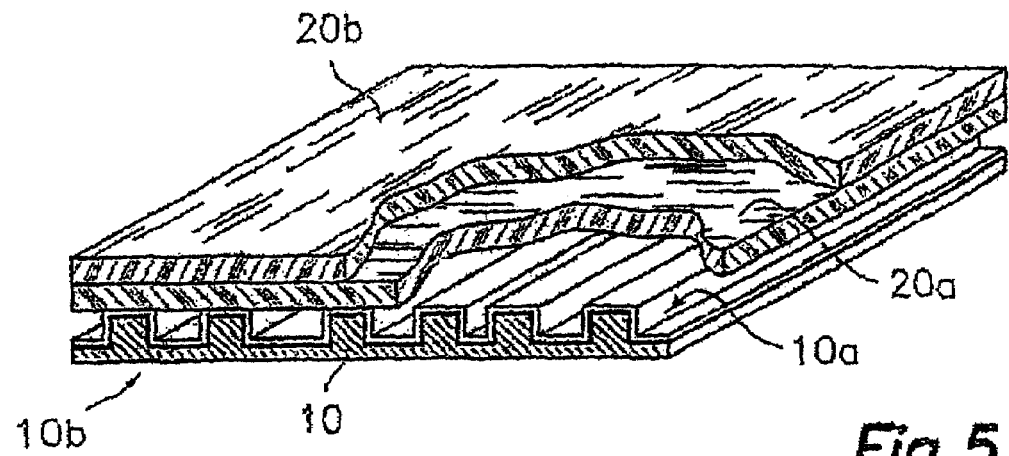
FIG. 5 shows a possible embodiment example of the invention in which two sheets are arranged in superimposition and crossed, for the purpose of compensating the possible effects by the mono-orientation of its fibers, derived from the extrusion.

As shown in FIG. 5, in a preferred embodiment of the invention, said step of subjecting the plate (10) and first sheet (20a) assembly to pressure includes successively depositing additional extruded sheets (20b, ... 20n) (two in the example in this figure) of said dielectric substrate material originating from the extrusion machine (60) on the assembly, the assembly resulting from depositing each extruded sheet having been rotated a predetermined angle before depositing a new extruded sheet, such that the main orientation of the fibers (derived from the extrusion) of each sheet or layer is different.

Figure 11:
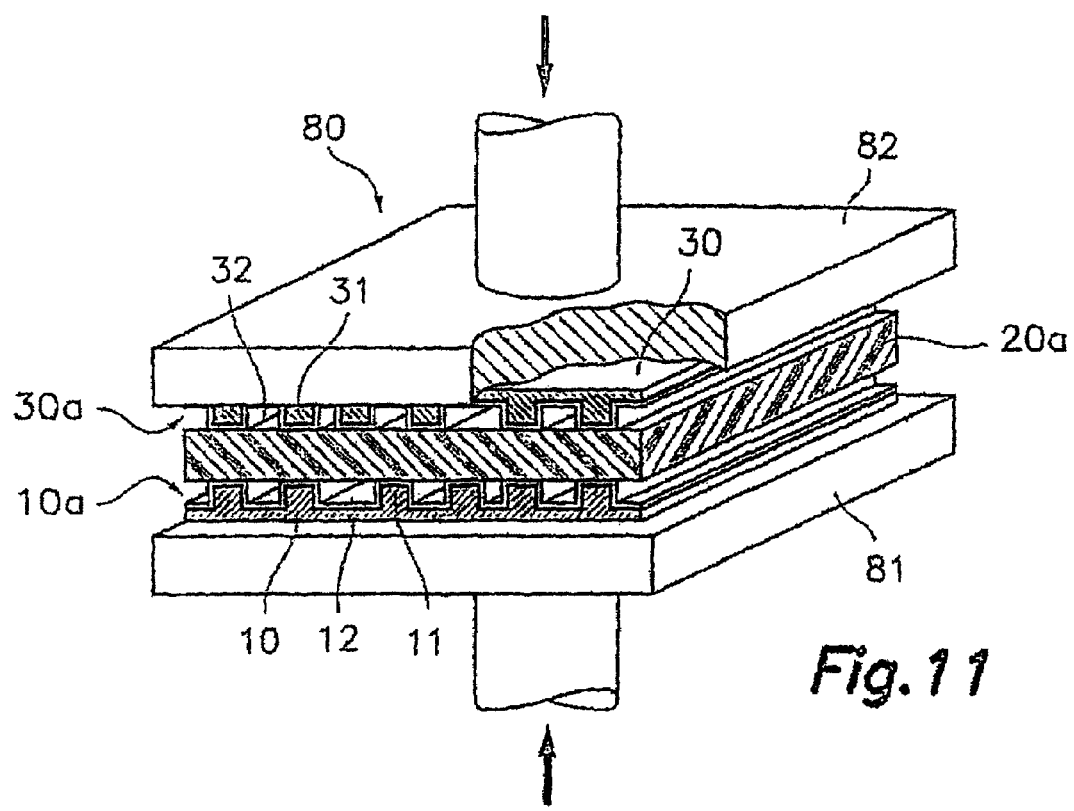
FIGS. 11 to 13 show several of said steps applied to obtaining a multi-layer circuit.
Figure 12:
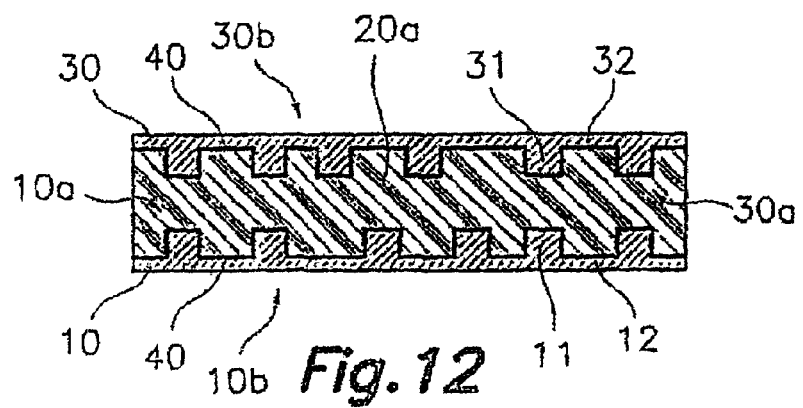
Figure 13:
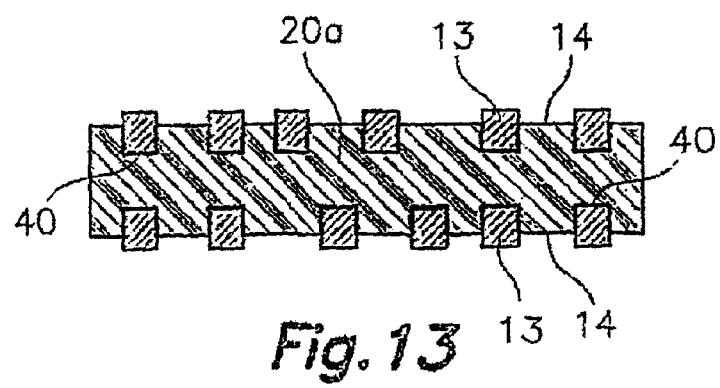

In the case that it is desirable to produce a double-sided printed circuit (FIGS. 11 to 13), the process further comprises: preparing a second plate (30) of electro-conductive material, carrying out a first selective engraving on one said side (30a) thereof so as to form several embossments (31) corresponding to future tracks and several depressions (32) corresponding to future inter-track areas; before the step of subjecting the plate (10) and first sheet (20a) assembly, and additional sheets (20b, ... 20n) where applicable, to pressure, applying said second plate (30) onto the last sheet (20a, 20b, ... 20n) deposited on the assembly, with said first side (30a) in contact with it; and after the step of subjecting the assembly to pressure and once said dielectric substrate material has hardened, carrying out an additional second selective engraving on a second side (30b), opposite the first, of said second plate (30) of electro-conductive material in order to eliminate the material thereof corresponding to said future intertrack areas, such that several tracks (13) remain that are isolated from each other, separated by inter-track areas (14) and partially enclosed on two opposite sides by said dielectric substrate material (20a, 20b, ... 20n).

According to one aspect of the invention, the engraving of the first engraving step for carrying out said depressions (12) corresponding to future inter-track areas (14) reaches a depth of 85 to 95% of the thickness of the plate (10) of electro-conductive material such that said finished tracks (13), partially enclosed in the dielectric material (20a, 20b, ... 20n), have an emerging part that is from 5 to 15% of its thickness.

According to an additional aspect of the invention, said copper plate(s) (10, 30) has/have an approximate thickness of 400 μm, suitable for power applications.

It must be pointed out that the additional details and/or measures with regard to finishing the either single- or double-sided printed circuit board (FIGS. 7 to 10 and FIGS. 12–13, respectively), as well as the prior preparation of the sides 10a, 30a for improving the junction (surface treatment with black oxide and adhesive application) basically correspond to those already disclosed in said patent application PCT/ES99/00413.

Thus, in accordance with a preferred embodiment, said previously engraved first side(s) (10a, 30a) of the plate(s) (10, 30) of electro-conductive material are subjected to a surface treatment for improving the junction capacitance and then a layer of adhesive material (50) is applied to them before depositing the dielectric substrate material (20a, 20b, ... 20n).

Figure 2:
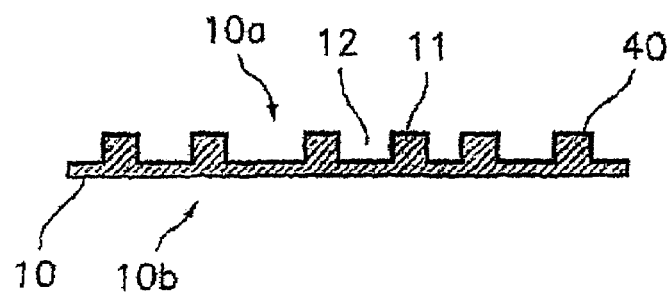
Figure 3:
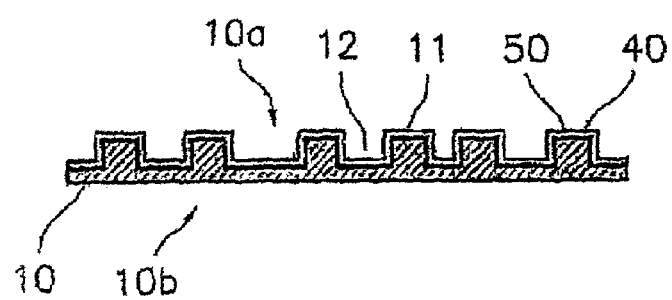

As shown in FIG. 2, said surface treatment for improving the junction capacitance comprises a black oxide (40) operation consisting of putting said first side (10a) of the plate (10) (and the same would be done with plate 30) of electro-conductive material into contact with an aqueous solution of sodium hydroxide and sodium hypochlorite, producing a micro-etching suitable for providing a determined surface roughness.

In order to carry out said black oxide operation, the following phases are carried out: applying a protective mask to said second side(s) (10b, 30b) and/or parts of the plate(s) (10, 30) of electro-conductive material which do not need to be treated; subjecting the plate(s) (10, 30) of electro-conductive material to said treatment by immersion or spraying; and subsequently removing said protective mask in order to leave a layer of black oxide (40) only in those areas intended to receive the dielectric material (20a, 20b, ... 20n).

Alternately, said black oxygen operation comprises: completely subjecting the plate(s) (10, 30) of electro-conductive material to said treatment by immersion or spraying; and subsequently eliminating the black oxidation from said second side(s) (10b, 30b) and/or parts which do not need said treatment in order to leave a layer of black oxide (40) only in those areas intended to receive the dielectric material (20a, 20b, ... 20n).

On the other hand, the application of a layer of an adhesive material (50) is preferably carried out by spraying, and said adhesive material (50) comprises an organic solvent base and a solids content formed by synthetic elastomers.

According to a preferred embodiment of the invention, said layer of adhesive material (50) is subjected to a pre-drying, without reaching curing, in order to provoke evaporation of said solvents before the jet molding step, said pre-drying operation being carried out openly at room temperature or alternately in an oven at a temperature of 25 to 100° C.

In this manner, during said step of subjecting the assembly to pressure, the adhesive material (50) is actuated by virtue of said pressure and of the temperature of the dielectric material (20a, 20b, ... 20n), carrying out an adherence between said dielectric material (20a, 20b, . . . 20n) and the plate(s) (10, 30) of electro-conductive material.

The essential features of the invention are detailed in the following claims.

The invention claimed is:

1. Process for manufacturing printed circuit boards from an extruded polymer comprising the steps:

preparing at least one plate (10) of electro-conductive material, carrying out a first selective engraving on a first side (10a) thereof so as to form several embossments (11) corresponding to future tracks and several depressions (12) corresponding to future inter-track areas;

applying a dielectric substrate material, in a pasty or semi-pasty state, on said first side (10a) of the plate (10) of electro-conductive material, covering said embossments (11) and filling said depressions (12); and once said dielectric substrate material has hardened, carrying out a second selective engraving on a second side (10b), opposite the first one, of said at least one plate (10) of electro-conductive material so as to eliminate said dielectric substrate material thereof corresponding to said future inter-track areas, giving several finished tracks (13) isolated from each other by inter-track areas (14) and partially enclosed on one side by said dielectric substrate material, characterized in that said step of applying a substrate material comprises:

obtaining by extrusion at least one first heated sheet (20a) of said dielectric substrate material from a thermal-plastic material;

depositing said first heated sheet (20a) on said first side (10a) of the plate (10) of electro-conductive material; and subjecting the first heated sheet (20a) and plate (10) assembly to a predetermined pressure so that the dielectric substrate material completely fills said depressions (12) and encloses said embossments (11).

2. Process according to claim 1, characterized in that said step for depositing the first heated sheet (20a) on the first side (10a) of the plate (10) of electro-conductive material includes placing the plate (10) between several plates (81, 82) of a press (80) located immediately next to the outlet of an extrusion machine (60) of said thermal-plastic dielectric substrate material and then depositing said first heated sheet (20a) on the plate (10) just as it comes out of said extrusion machine (60).

3. Process according to claim 2, characterized in that before said step of subjecting the plate (10) and first heated sheet (20a) assembly to pressure, a successive deposit of additional extruded sheets (20b, . . . 20n) of said dielectric substrate material originating from the extrusion machine (60) on the assembly is included, the assembly resulting from depositing each extruded sheet having been rotated a predetermined angle before depositing a new extruded sheet.

4. Process according to claim 2, characterized in that it also comprises:

preparing a second plate (30) of electro-conductive material, carrying out a first selective engraving on a first side (30a) thereof so as to form several embossments (31) corresponding to future tracks and several depressions (32) corresponding to future inter-track areas;

before the step of subjecting the plate (10) and first heated sheet (20a) assembly, and additional sheets (20b, . . . 20n) where applicable, to pressure, applying said second plate (30) on the last of said sheets (20a, 20b, . . . 20n) deposited on the assembly, with said first side (30a) in contact with it; and after the step of subjecting the assembly to pressure and once said dielectric substrate material has hardened, carrying out an additional second selective engraving on a second side (30b), opposite the first of said second plate (30) of electro-conductive material so as to eliminate said dielectric substrate material thereof corresponding to said future inter-track areas, such that several tracks (13) remain that are isolated from each other, separated by inter-track areas (14) and partially enclosed on two opposite sides by said dielectric substrate material (20a, 20b, . . . 20n).

5. Process according to claim 3, characterized in that it also comprises:

preparing a second plate (30) of electro-conductive material, carrying out a first selective engraving on a first side (30a) thereof so as to form several embossments (31) corresponding to future tracks and several depressions (32) corresponding to future inter-track areas;

before the step of subjecting the plate (10) and first heated sheet (20a) assembly, and additional sheets (20b, . . . 20n) where applicable, to pressure, applying said second plate (30) on the last of said sheets (20a, 20b, . . . 20n) deposited on the assembly, with said first side (30a) in contact with it; and after the step of subjecting the assembly to pressure and once said dielectric substrate material has hardened, carrying out an additional second selective engraving on a second side (30b), opposite the first, of said second plate (30) of electro-conductive material so as to eliminate said dielectric substrate material thereof corresponding to said future inter-track areas, such that several tracks (13) remain that are isolated from each other, separated by inter-track areas (14) and partially enclosed on two opposite sides by said dielectric substrate material (20a, 20b, . . . 20n).

6. Process according to claims 1, 2, 3, 4, or 5, characterized in that it comprises subjecting said previously engraved first side(s) (10a, 30a) of the plate(s) (10, 30) of electro-conductive material to a surface treatment for improving the junction capacitance; and applying a layer of adhesive material (50) on said engraved and superficially treated first side(s) (10a, 30a) of the plate(s) (10, 30) of electro-conductive material before applying the dielectric substrate material (20a, 20b, . . . 20n).

7. Process according to claim 6, characterized in that said application of a layer of adhesive material (50) is carried out by spraying.

8. Process according to claim 6, characterized in that during said step of subjecting the assembly to pressure, the adhesive material (50) is activated, by virtue of said pressure and of the temperature of the dielectric material (20a, 20b, . . . 20n), an adherence thus being carried out between said dielectric material (20a, 20b, . . . 20n) and the plate(s) (10, 30) of electro-conductive material.

9. Process according to claim 6, characterized in that said surface treatment for improving the junction capacitance comprises a black oxide (40) operation consisting of puffing said first side(s) (10a, 30a) of the plate(s) (10, 30) of electro-conductive material into contact with an aqueous solution of sodium hydroxide and sodium hypochlorite, producing a micro-etching so as to provide a determined surface roughness.

10. Process according to claim 9, characterized in that said black oxide operation comprises:
- applying a protective mask to said second side(s) (10b, 30b) and/or parts of the plate(s) (10, 30) of electro-conductive material which do not need to be treated;
- subjecting the plate(s) (10, 30) of electro-conductive material to said treatment by immersion or spraying; and
- subsequently removing said protective mask so as to leave a layer of black oxide (40) only in those areas intended to receive the dielectric material (20a, 20b, ... 20n).

11. Process according to claim 9, characterized in that said black oxide operation comprises:
- completely subjecting the plate(s) (10, 30) of electro-conductive material to said treatment by immersion or spraying; and
- subsequently removing the black oxidation from said second side(s) (10b, 30b) and/or parts that do not need said treatment so as to leave a layer of black oxide (40) only in those areas intended to receive the dielectric material (20a, 20b, ... 20n).

12. Process according to claim 6, characterized in that said adhesive material (50) comprises an organic solvent base and a solids content formed by synthetic elastomers.

13. Process according to claim 12, characterized in that said layer of adhesive material (50) is subjected to pre-drying, without reaching curing, so as to provoke evaporation of said solvents before the jet molding step.

14. Process according to claim 13, characterized in that said pre-drying is carried out openly at room temperature.

15. Process according to claim 13, characterized in that said pre-drying is carried out in an oven at a temperature of 25 to 100° C.

16. Process according to claims 1, 4, or 5 characterized in that the engraving of the first engraving step of the plate (10, 30) so as to carry out said depressions (12) corresponding to future inter-track areas (14) reaches a depth of 85 to 95% of the thickness of the plate (10, 30) of electro-conductive material, such that said finished tracks (13), partially enclosed in the dielectric material (20a, 20b, ... 20n), have an emerging part which is from 5 to 15% of its thickness.

17. Process according to claims 1, 4, or 5 characterized in that said plate(s) (10, 30) of electro-conductive material is/are copper plate(s).

18. Process according to claim 17, characterized in that said copper plate(s) (10, 30) has/have an approximate thickness of 400 μm, suitable for power applications.

* * * * *